(12) United States Patent
Wang et al.

(10) Patent No.: US 11,032,407 B2
(45) Date of Patent: Jun. 8, 2021

(54) BACK COVER FOR MOBILE DEVICES WITH ADJUSTABLE APPEARANCE

(71) Applicant: Furcifer Inc., Fremont, CA (US)

(72) Inventors: Jian Wang, Fremont, CA (US); Yan Zhou, Fremont, CA (US)

(73) Assignee: Furcifer Inc., Fremont, CA (US)

( * ) Notice: Subject to any disclaimer, the term of this patent is extended or adjusted under 35 U.S.C. 154(b) by 0 days.

(21) Appl. No.: 16/534,933

(22) Filed: Aug. 7, 2019

(65) Prior Publication Data

US 2021/0044687 A1 Feb. 11, 2021

(51) Int. Cl.
| | | |
|---|---|---|
| *H04M 1/02* | (2006.01) | |
| *H05K 5/03* | (2006.01) | |
| *G02F 1/153* | (2006.01) | |
| *G02F 1/1333* | (2006.01) | |
| *G02F 1/1334* | (2006.01) | |
| *G02F 1/163* | (2006.01) | |
| *G02F 1/1685* | (2019.01) | |
| *G02F 1/13* | (2006.01) | |
| *G02F 1/137* | (2006.01) | |
| *G02F 1/16755* | (2019.01) | |

(52) U.S. Cl.
CPC .......... *H04M 1/0283* (2013.01); *G02F 1/132* (2013.01); *G02F 1/137* (2013.01); *G02F 1/1334* (2013.01); *G02F 1/133305* (2013.01); *G02F 1/1533* (2013.01); *G02F 1/163* (2013.01); *G02F 1/1685* (2019.01); *G02F 1/16755* (2019.01); *H05K 5/03* (2013.01); *G02F 1/13345* (2021.01)

(58) Field of Classification Search
CPC ...... H04M 1/0283; G02F 1/137; G02F 1/163; G02F 1/1685; G02F 1/16755; G02F 1/133305; G02F 1/132; G02F 1/1533; G02F 1/1334; G02F 2001/13345; H05K 5/03

See application file for complete search history.

(56) References Cited

U.S. PATENT DOCUMENTS

| | | | | |
|---|---|---|---|---|
| 6,515,787 B1* | 2/2003 | Westfall | ............... | G02F 1/1523 359/265 |
| 6,597,489 B1* | 7/2003 | Guarr | .................... | G02F 1/155 359/266 |
| 7,142,190 B2* | 11/2006 | Martinez | ............... | G06F 1/1613 345/106 |
| 7,414,771 B2* | 8/2008 | Martin | .................. | G02F 1/1525 359/265 |

(Continued)

FOREIGN PATENT DOCUMENTS

| | | |
|---|---|---|
| CN | 109581777 A | 4/2019 |
| NO | 2015/018948 A1 | 2/2015 |

OTHER PUBLICATIONS

Search Report for European Application No. 20188972.2, dated Oct. 19, 2020, 8 pages.

*Primary Examiner* — Julio R Perez

(57) ABSTRACT

In one aspect, the appearance of a back cover for a mobile device may be changed. For example, the back cover may include a film that affects the appearance of the back of the mobile device, such as the color or tint. By changing properties of the film, the appearance of the mobile device is also changed. Examples of such films include electrochromic films, polymer-dispersed liquid crystal or polymer network liquid crystal, and suspended particle films.

13 Claims, 4 Drawing Sheets
(4 of 4 Drawing Sheet(s) Filed in Color)

(56) References Cited

U.S. PATENT DOCUMENTS

| | | | |
|---|---|---|---|
| 8,537,543 B2* | 9/2013 | Wang | H04M 1/0249 |
| | | | 361/679.56 |
| 2007/0035739 A1 | 2/2007 | Tung | |
| 2007/0076286 A1* | 4/2007 | Sung | G02F 1/1525 |
| | | | 359/265 |
| 2010/0123666 A1 | 5/2010 | Wickholm et al. | |
| 2015/0166333 A1* | 6/2015 | Li | B81B 7/0058 |
| | | | 257/415 |
| 2016/0043765 A1* | 2/2016 | Ozeki | B32B 7/05 |
| | | | 428/41.8 |
| 2019/0049758 A1* | 2/2019 | Frischmuth | G02F 1/1334 |
| 2020/0140615 A1* | 5/2020 | Auman | C08J 5/18 |

* cited by examiner

BACK COVER FOR MOBILE DEVICES WITH ADJUSTABLE APPEARANCE

BACKGROUND

1. Technical Field

This disclosure relates to mobile devices and their appearance.

2. Description of Related Art

There are many mobile devices in today's world. Cell phones, tablets, smart watches, and other wearables are just some examples. In most cases, the appearance of the mobile device is an important part of the overall aesthetic value. For example, the size of the screen, the width of any border around the screen, and the color and shape of the back and sides are important to the overall appearance of the device.

For some devices, accessories are available to provide protection, provide additional functionality and/or to change the device's appearance. For example, back covers are an important accessory for cell phones. They can be designed to provide shock-resistance and waterproofing, and may include additional batteries for extended operation. Back covers also come in many different colors and patterns, to allow users to customize the appearance of their cell phones.

SUMMARY

In one aspect, an appearance of the back cover for a mobile device may be changed, for example by the user or alternatively by the device itself. For example, the back cover may include a film that affects the appearance of the back of the mobile device, such as the color or tint. By changing properties of the film, the appearance of the mobile device is also changed. Examples of such films include electrochromic films, polymer-dispersed liquid crystal or polymer network liquid crystal, and suspended particle films. The back cover may be an integral part of the device itself or it may be a separate accessory back cover for the mobile device.

Other aspects include components, devices, systems, improvements, methods, processes, applications, computer readable mediums, and other technologies related to any of the above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

In one approach, changing the appearance of a cell phone back cover is achieved through the use of an electrochromic film. Electrochromic materials are able to change their bandgap by doping and de-doping chemical reactions. As a result, they can be used to create devices that modulate optical properties, such as transmittance, reflectance, absorptance, or emittance, under the control of an electrical voltage or current.

Figure 1:
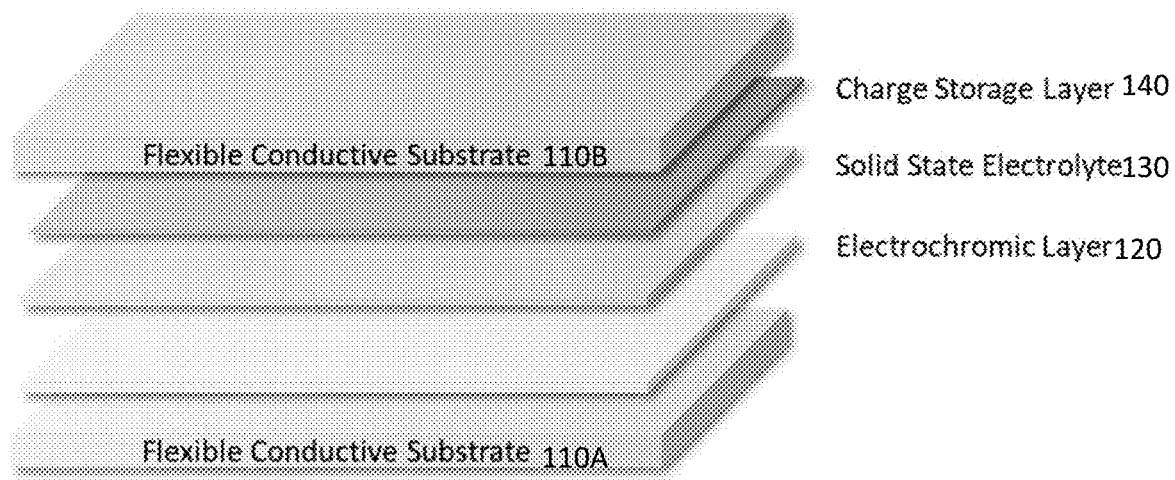
FIG. 1 is a schematic illustration of an electrochromic film stack.

FIG. 1 is a schematic illustration of such a device, which takes the form of a stack 100 of different layers of materials. To fabricate the stack 100, flexible conductive substrates 110 are used. The flexible substrates 100 may be metal film, plastic, super-thin glass, etc. For the substrates 100, the conductor may be metal layer, metal oxide such as ITO (indium tin oxide) or IZO (indium zinc oxide), metal mesh, carbon nanowires, metal nanowires, dielectric-metal-dielectric layer, etc. An electrochromic polymer 120 is deposited on top of flexible conductive substrate 110A by a wet coating process. Examples of wet coating processes include spin-coating, spray-coating, slot-die coating, dip-coating, blade-coating, meyer bar-coating, gravure-coating, ink-jet printing, screen printing, etc. The thickness of the polymer layer 120 depends on the extinction coefficient of the polymer.

On another flexible conductive substrate 110B, a charge storage layer 140 is deposited via a wet coating process. The charge storage layer may include vanadium oxide, binary oxides (e.g., CoO, $IrO_2$, MnO, NiO, and $PrO_x$), ternary oxides (e.g., $Ce_xV_yO_z$), etc. In between the two coated substrates, the solid-state electrolyte 130 is laid down by a wet coating process. The solid-state electrolyte 130 may be deposited either on top of the electrochromic polymer layer 120, or on top of the charge storage layer 140. After the solid state electrolyte 130 is laid down, the two flexible coated substrates are laminated together to form the complete film stack shown in FIG. 1.

To operate the film stack 100, an external voltage is applied between the top and the bottom substrates 110. By injecting or extracting charges from the electrochromic layer 120, the state of the transmission, reflectance, or color of the stack 100 is altered.

Figure 2:
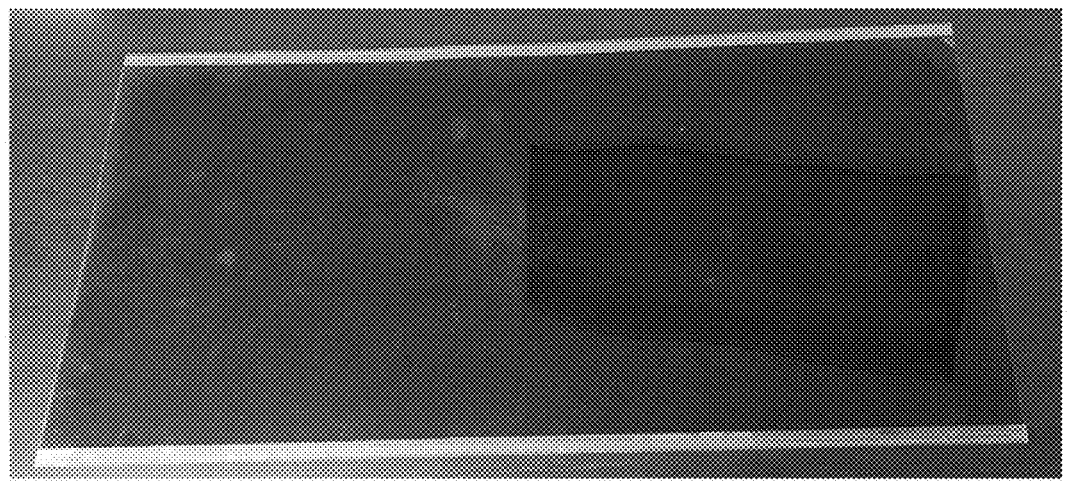
FIG. 2 is a photograph of an electrochromic film stack.

FIG. 2 is a photograph of an electrochromic film stack.

Figure 3:
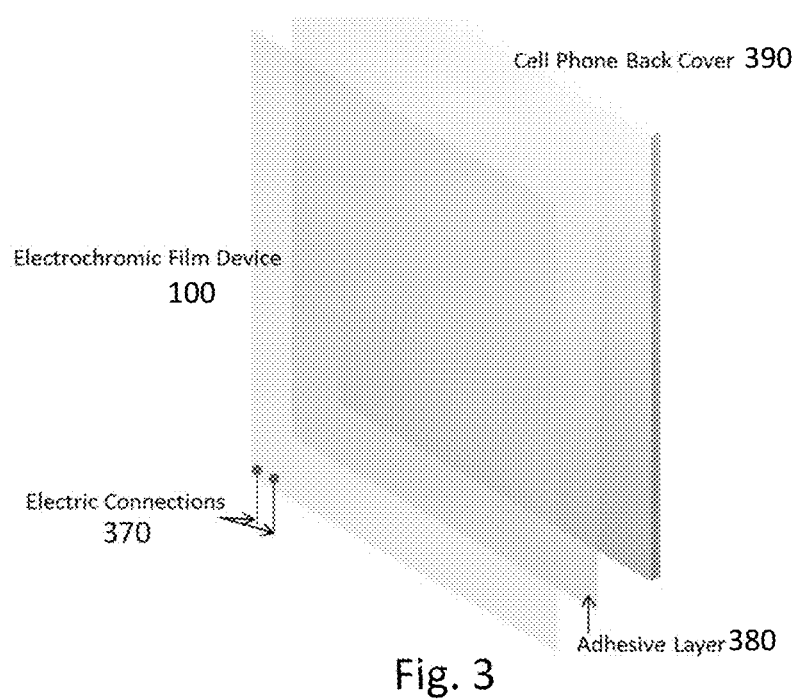
FIG. 3 is a schematic illustration of an electrochromic film stack laminated onto a cell phone back cover.

In one approach, the electrochromic film stack 100 is directly integrated onto the structural shell of a cell phone back cover, producing the structure shown in FIG. 3. FIG. 3 is a schematic illustration of an electrochromic film stack laminated onto a cell phone back cover 390. The back cover 390 may be an integral part of the cell phone or it may be an accessory back cover. The film stack may be produced as follows.

Figure 4:
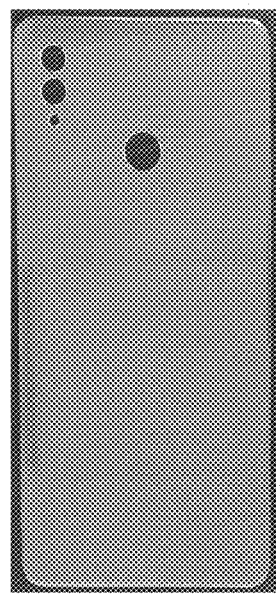
FIG. 4 is a photograph of a cell phone back cover.

The film stack 100 is cut to the size of the cell phone back cover. Some areas of the film stack 100 are removed to expose the back cover's openings, such as the rear camera opening, fingerprint scanner opening, etc. FIG. 4 is a photograph of a cell phone back cover before the film stack is applied. In this back cover, there are four openings for two rear cameras, one flashlight, and one fingerprint scanner. The film stack 100 overlapping the openings are removed. The remaining film stack 100 covers the entire back of the mobile device, exclusive of the openings. Thus, the appearance of the entire back is changeable by the user.

Electric connectors 370 are attached to the film stack 100 to control the electrochromic layer. In one approach, the electric connectors 370 plug into the phone and are controlled through the phone. For example, the user may control the appearance of the film stack via an app or the control panel for the phone. Alternatively, the phone itself may control the appearance of the film stack, for example to match different schemes or themes on the phone.

An adhesive layer 380 attaches the film stack to the structural shell 390 of the back cover. The adhesive layer could be any optically clear adhesive (OCA), PVB, EVA, SentryGlas, etc. In one approach, the adhesive layer 380 is applied on the outside surface of the film stack 100 during fabrication of the stack. The adhesive then is protected by a liner film. During the integration process, the liner film is removed and the electrochromic film stack 100 is laminated onto the structural shell 390.

Alternatively, the adhesive layer 380 could be applied to the structural shell 390 during its fabrication. The adhesive then is protected by a liner film. During the integration process, the liner film is removed and the electrochromic film stack 100 is laminated onto the structural shell 390.

Figure 5:
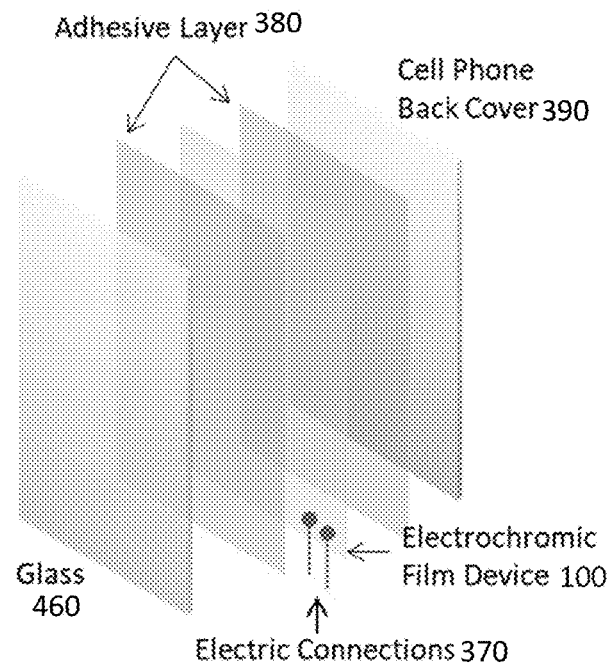
FIG. 5 is a schematic illustration of an electrochromic film stack sandwiched between a cell phone back cover and a piece of glass.

Another way to integrate the electrochromic film stack 100 is shown in FIG. 5. FIG. 5 is a schematic illustration of an electrochromic film stack 100 sandwiched between the structural shell 390 for the back cover and a glass cover 460. The electrochromic film stack 100 is sandwiched between two adhesive layers 380. The two adhesive layers 380 bond the electrochromic film stack 100 to the back cover structural shell 390 and to the glass cover 460, respectively, as schematically illustrated in FIG. 5.

Figure 6:
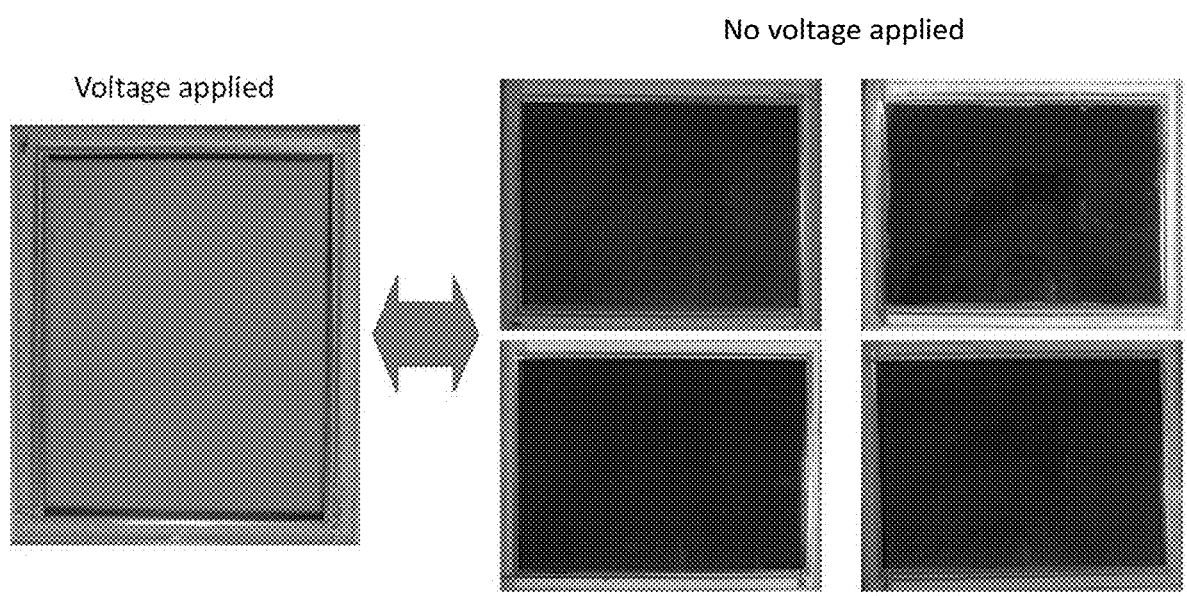
FIG. 6 are photographs of cell phone back covers integrated with different colored electrochromic film stacks.

FIG. 6 are photographs of cell phone back covers integrated with different colored electrochromic film stacks. The photograph to the left of the double arrow shows the back covers when an external voltage is applied. The electrochromic film stack's color is changed from dark state to clear state (without any color). After applying a reverse voltage, the clear state is changed back to the color state, as shown by the four different back covers to the right of the double arrow. Each back cover uses a different color electrochromic film stack. Clockwise from the upper right, the colors are blue, neutral grey, red and green.

Figure 7:
FIG. 7 is a photograph of a curved cell phone back cover.

One advantage of the electrochromic film stack is its flexibility. Because the substrates are flexible and the functional electrochromic material is organic polymer based, the complete film stack may be bent, rolled, or warped without losing its functionality. Cell phone back covers may be curved, such as the clear shown in FIG. 7. FIG. 7 is a photograph of a cell phone and a corresponding curved back cover. Because the electrochromic film stack is flexible, it may be integrated onto curved back covers. The integration process described above may be used for the integration. If the electrochromic film stack covers both the back and sides, then the appearance of both the back and sides will be changeable by the user.

Other types of materials may also be used to implement a change in appearance. Thermochromic materials may change color or tint due to a change in temperature. Two common materials are liquid crystal and leuco dyes.

Some liquid crystals are capable of changing colors above the transition temperature. When the temperature is higher than the transition temperature, the liquid crystals go from the low-temperature crystallic phase to the high-temperature isotropic liquid phase, which results in a tint change. Liquid crystals used in dyes and inks often come microencapsulated, in the form of suspension.

Thermochromic dyes are based on mixtures of leuco dyes with suitable other chemicals. The mixture can switch color usually between the colorless leuco form and the colored form depending on the temperature. The mixtures are usually sealed inside microcapsules.

Figure 8:
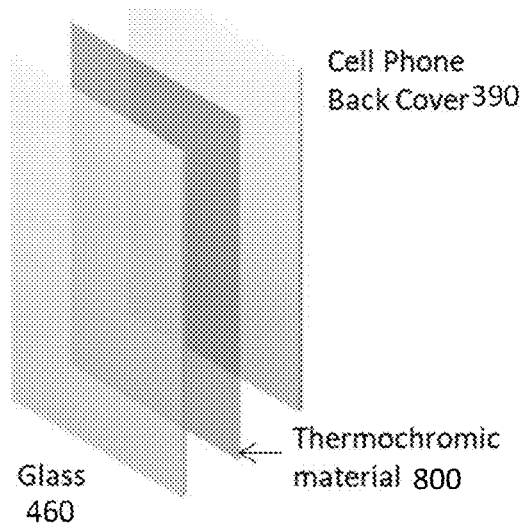
FIG. 8 is a schematic illustration of a thermochromic material sandwiched between a cell phone back cover and a piece of glass.

Different approaches may be used to implement thermochromic materials in the form of suspension onto a cell phone back cover. In one approach, the suspension is first encapsulated between two pieces of plastic film. Then, the film is laminated directly on the structural shell as illustrated in FIG. 4, or between the structural shell and a piece of glass as illustrated in FIG. 5. In the case of thermochromic materials, no electrodes are needed. The color or tint changes automatically with the temperature. In another approach shown in FIG. 8, the suspension 800 is directly encapsulated between the structural shell 390 and a cover glass 460.

Other embodiments may be based on photochromic materials. Photochromic materials change color or tint upon exposure to light. The light induces photochemical reactions of the photochromic materials, which changes the strength or the wavelength of its absorption spectra.

Figure 9:
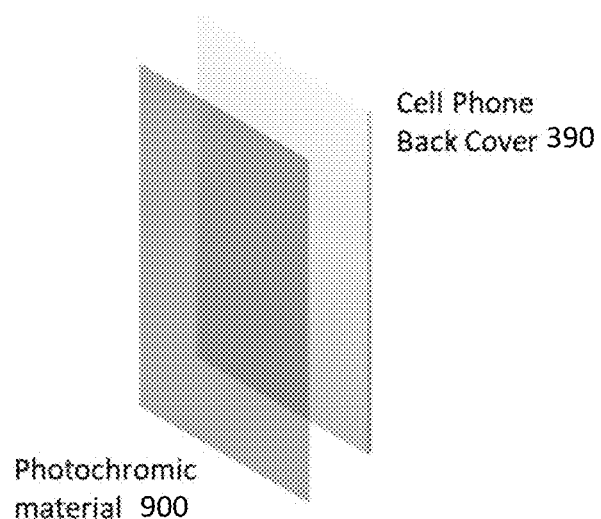
FIG. 9 is a schematic illustration of a photochromic material applied directly onto a cell phone back cover.

FIG. 9 is a schematic illustration of a photochromic material 900 applied directly onto the structural shell 390 of a cell phone back cover. No additional cover glass is needed.

As another example, color change may be based on polymer-dispersed liquid-crystal (PLDC) or polymer network liquid crystal (PNLC). Polymer-dispersed liquid crystal devices may be created as follows. Liquid crystals are dissolved or dispersed into a liquid polymer followed by solidification or curing of the polymer. Without any external voltage, the liquid crystals are randomly aligned in the droplets. The randomly distributed liquid crystal molecules scatter the incident light. As a result, the devices are non-transparent, having a "milky white" appearance. When an external voltage is applied to the two transparent electrodes, the electric field aligns the liquid crystal molecules, allowing light to pass through the device with very little scattering and resulting in a transparent state.

In polymer network liquid crystal devices, the liquid crystal molecules are aligned during device fabrication. Therefore, without external voltage, the PNLCs' state is transparent. When external voltage is applied, PNLCs switch from transparent to opaque.

PDLC/PNLC stacks may be integrated onto cell phone back covers using approaches similar to those shown in FIGS. 4 and 5 above. The film device is either applied directly onto the structural shell or sandwiched between the shell and a cover glass.

As a final example, SPDs are suspended-particle devices, in which rod-like nano-sized particles are suspended in a liquid laminated between two pieces of glass or plastic film. Without any external voltage, the suspended particles are randomly distributed inside the liquid, thereby blocking and absorbing the light passing through. When an external voltage is applied, the suspended particles align and allow the light passing through. The devices become transparent.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A back cover for a mobile device, the back cover comprising an electrochromic film device attached to a back of the mobile device, wherein the electrochromic film device includes:
   an electrochromic layer, wherein a thickness of the electrochromic layer is based on an extinction coefficient;
   a charge storage layer comprising a metal oxide; and
   a suspension encapsulated between two films, the suspension comprising a mixture having a crystalline phase below a transition temperature of the mixture and an isotropic liquid phase above the transition temperature, the mixture being adjusted in tint in response to a temperature increasing to above the transition temperature, wherein:
   the electrochromic device and an appearance of the back of the mobile device is controlled either by a user of the mobile device via a software setting or automatically by the mobile device itself.

2. The back cover of claim 1, wherein the electrochromic film device covers a portion of the back of the mobile device without covering first and second openings for cameras, a third opening for a flashlight, and a fourth opening for a fingerprint scanner.

3. The back cover of claim 1, wherein the back cover and the electrochromic film device are non-planar and cover both the back and sides of the mobile device, and the appearance of both the back and sides is changeable.

4. The back cover of claim 1, wherein the mobile device is a cell phone.

5. The back cover of claim 1, wherein the appearance of the back is changeable by electrically controlling the electrochromic film device.

6. The back cover of claim 1, further comprising two flexible conductive substrates between which the electrochromic film device is laminated.

7. The back cover of claim 1, further comprising a solid state electrolyte layer laminated between the charge storage layer and the electrochromic layer.

8. The back cover of claim 1, wherein the electrochromic film device and the appearance are optically controlled.

9. The back cover of claim 1, wherein the electrochromic film device affects a color of the back of the mobile device and the color is changeable by a user of the mobile device.

10. The back cover of claim 1, wherein the tint is changeable by a user of the mobile device.

11. The back cover of claim 1, further comprising:
   a structural shell; and
   two flexible substrates, wherein the electrochromic film device is laminated between the two flexible substrates and one of the substrates is attached by adhesive to the structural shell.

12. The back cover of claim 1, further comprising:
   a structural shell; and
   a glass cover, wherein the electrochromic film device is positioned between the structural shell and the glass cover.

13. The back cover of claim 1, further comprising:
   a structural shell, wherein the electrochromic film device is attached by adhesive directly to the structural shell.

* * * * *